(12) United States Patent
Aoyagi et al.

(10) Patent No.: US 9,450,161 B2
(45) Date of Patent: Sep. 20, 2016

(54) METHOD OF MANUFACTURING A LIGHT-EMITTING DEVICE BY SINTERING CONDUCTIVE PASTES

(71) Applicant: Seiko Epson Corporation, Tokyo (JP)

(72) Inventors: Kunihiko Aoyagi, Yokohama (JP); Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/668,039

(22) Filed: Mar. 25, 2015

(65) Prior Publication Data

US 2015/0280090 A1  Oct. 1, 2015

(30) Foreign Application Priority Data

Mar. 27, 2014  (JP) ................. 2014-065274

(51) Int. Cl.
*H01L 33/62* (2010.01)
*H04N 5/74* (2006.01)
*H04N 9/31* (2006.01)
*H01L 33/00* (2010.01)

(52) U.S. Cl.
CPC .......... *H01L 33/62* (2013.01); *H01L 33/0079* (2013.01); *H04N 5/7441* (2013.01); *H04N 9/3164* (2013.01); *H01L 2933/0066* (2013.01)

(58) Field of Classification Search
CPC .............. H01L 33/62; H01L 33/0079; H01L 2933/0066; H04N 5/7441; H04N 9/3164
USPC ......................... 445/49–51, 23–25
See application file for complete search history.

(56) References Cited

U.S. PATENT DOCUMENTS 8,609,444 B2   12/2013   Wada et al.

FOREIGN PATENT DOCUMENTS

| JP | 2004-055713 A | 2/2004 |
| JP | 2008-311371 A | 12/2008 |
| JP | 2012-178401 A | 9/2012 |
| JP | 5549190 B2 | 7/2014 |

*Primary Examiner* — Joseph L Williams
(74) *Attorney, Agent, or Firm* — Harness, Dickey & Pierce, P.L.C.

(57) ABSTRACT

A method of manufacturing a light-emitting device, includes: disposing a first conductive paste on a substrate and sintering the first conductive paste to form a first bonding layer; disposing a second conductive paste on a semiconductor light-emitting element and sintering the second conductive paste to form a second bonding layer; polishing surfaces of the first bonding layer and the second bonding layer; and causing a third conductive paste to intervene between the first bonding layer and the second bonding layer and sintering the third conductive paste to bond the first bonding layer and the second bonding layer together.

18 Claims, 9 Drawing Sheets

METHOD OF MANUFACTURING A LIGHT-EMITTING DEVICE BY SINTERING CONDUCTIVE PASTES

BACKGROUND

1. Technical Field

The present invention relates to a method of manufacturing a light-emitting device, a light-emitting device, and a projector.

2. Related Art

In recent years, the development of semiconductor light-emitting elements has been energetically performed. As specific semiconductor light-emitting elements, a semiconductor laser (laser diode), a super luminescent diode (hereinafter also referred to as "SLD"), a light-emitting diode (LED), and the like have been known.

In light-emitting devices including such a semiconductor light-emitting element, the semiconductor light-emitting element is mounted on a support substrate such as a copper base for the purpose of efficiently dissipating the heat of the semiconductor light-emitting element (for example, refer to JP-A-2008-311371). In a light-emitting device disclosed in JP-A-2008-311371, a Cu substrate and a semiconductor light-emitting element are bonded via a bonding layer as a sintered body of Ag nanoparticles. It is considered that such a bonding layer can enhance thermal conductivity and thus the heat of the semiconductor light-emitting element can be efficiently conducted to the Cu substrate via the bonding layer.

The light-emitting device disclosed in JP-A-2008-311371 is manufactured as follows: a conductive paste is disposed on the Cu substrate; the conductive paste is subjected to a sintering process to form a first bonding layer; the first bonding layer and the semiconductor light-emitting element are bonded via a conductive paste; the conductive paste is subjected to a sintering process to form a second bonding layer; the Cu substrate and the semiconductor light-emitting element are bonded via a bonding layer formed of the first and second bonding layers. However, there is no suggestion about the state of the surface of the first bonding layer. In general, since relatively large irregularities are formed on the surface of the first bonding layer subjected only to a sintering process, voids (air bubbles) are likely to occur between the first bonding layer and the second bonding layer. The occurrence of voids reduces the heat transfer efficiency of the bonding layer, leading to a problem of reduced heat dissipation property.

SUMMARY

An advantage of some aspects of the invention is to provide a method of manufacturing a light-emitting device, by which the occurrence of voids in a bonding layer is suppressed and thus excellent heat dissipation property is provided, a light-emitting device with high reliability obtained by the manufacturing method, and a projector.

The advantage is achieved by the following configuration of the invention.

A method of manufacturing a light-emitting device according to an aspect of the invention includes: disposing a first conductive paste on a substrate and sintering the first conductive paste to form a first bonding layer; disposing a second conductive paste on a semiconductor light-emitting element and sintering the second conductive paste to form a second bonding layer; polishing surfaces of the first bonding layer and the second bonding layer; and causing a third conductive paste to intervene between the first bonding layer and the second bonding layer and sintering the third conductive paste to bond the first bonding layer and the second bonding layer together.

By polishing the surfaces of the first and second bonding layers as described above, the occurrence of voids can be suppressed between the first bonding layer and the third bonding layer and between the second bonding layer and the third bonding layer. Therefore, the heat transfer efficiency of the bonding layer can be enhanced, and thus a light-emitting device having excellent heat dissipation property can be manufactured.

In the method of manufacturing a light-emitting device according to the aspect of the invention, it is preferable that the first conductive paste, the second conductive paste, and the third conductive paste include metal particles having a particle size of from 1 nm to 100 nm.

With this configuration, since the fusing temperature of the third conductive paste can be kept low, the substrate and the semiconductor light-emitting element can be bonded together while reducing thermal damage.

In the method of manufacturing a light-emitting device according to the aspect of the invention, it is preferable that the second bonding layer is thicker than the first bonding layer.

With this configuration, even if the third bonding layer protrudes from a region between the first bonding layer and the second bonding layer, an unintended short circuit between the third bonding layer and the semiconductor light-emitting element can be suppressed.

In the method of manufacturing a light-emitting device according to the aspect of the invention, it is preferable that a surface roughness Ra of the first bonding layer and the second bonding layer is 10 µm or less.

With this configuration, the surfaces of the first and second bonding layers are sufficiently planarized, and thus the occurrence of voids can be more effectively suppressed.

In the method of manufacturing a light-emitting device according to the aspect of the invention, it is preferable that, in the polishing of the surfaces of the first bonding layer and the second bonding layer, the surfaces of the first bonding layer and the second bonding layer are polished by lap polishing.

With this configuration, the surfaces of the first and second bonding layers can be easily polished.

In the method of manufacturing a light-emitting device according to the aspect of the invention, it is preferable that an entire region of the third bonding layer is located within a region between the first bonding layer and the second bonding layer.

With this configuration, an unintended short circuit between the third bonding layer and other electrodes/wires or the like can be prevented.

A light-emitting device according to another aspect of the invention is manufactured by the method of manufacturing a light-emitting device according to the aspect of the invention.

With this configuration, the light-emitting device with high reliability is obtained.

A projector according to still another aspect of the invention includes: the light-emitting device according to the aspect of the invention; a light modulator that modulates light emitted from the light-emitting device in response to image information; and a projection device that projects an image formed by the light modulator.

With this configuration, the projector with high reliability is obtained.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a method of manufacturing a light-emitting device, a light-emitting device, and a projector according to the invention will be described in detail based on embodiments shown in the accompanying drawings.

1. Light-Emitting Device and Method of Manufacturing Light-Emitting Device

First Embodiment

First, a light-emitting device and a method of manufacturing the light-emitting device according to a first embodiment will be described.

Figure 1:
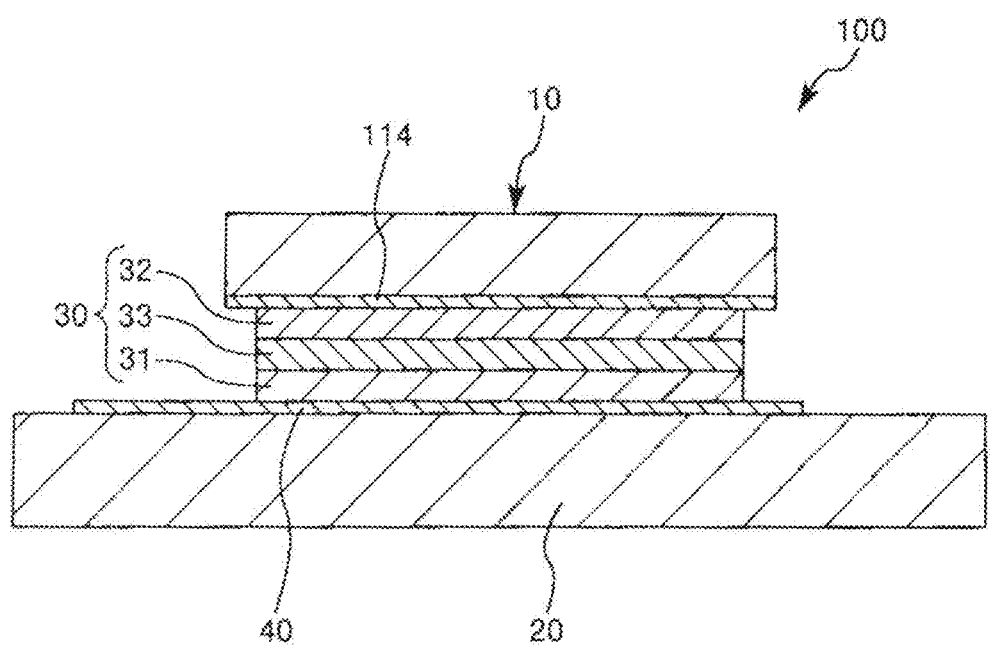
FIG. 1 is a cross-sectional view showing a light-emitting device according to a first embodiment of the invention.
Figure 2:
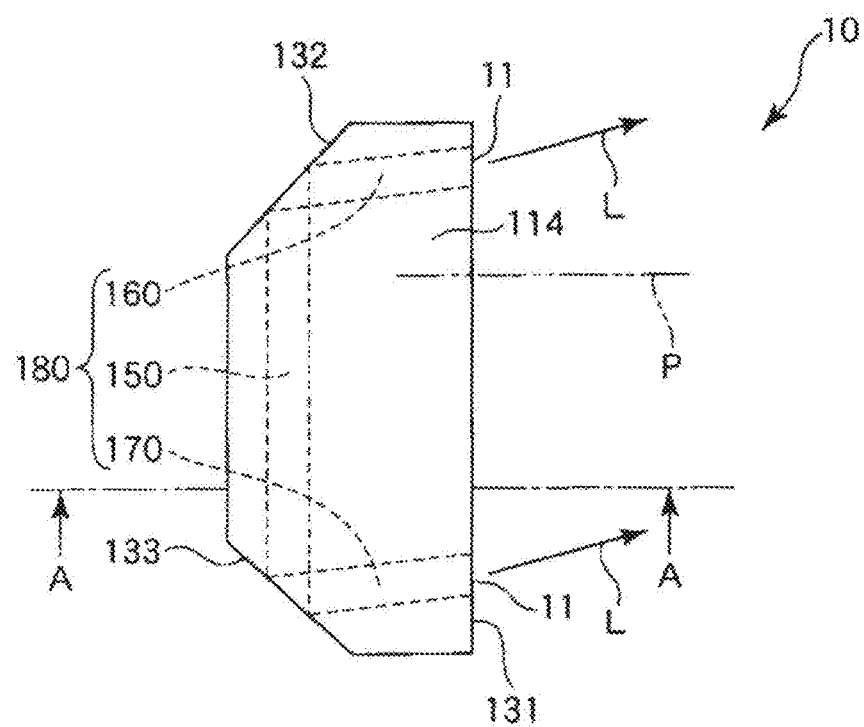
FIG. 2 is a plan view schematically showing a semiconductor light-emitting element included in the light-emitting device shown in FIG. 1.
Figure 3:
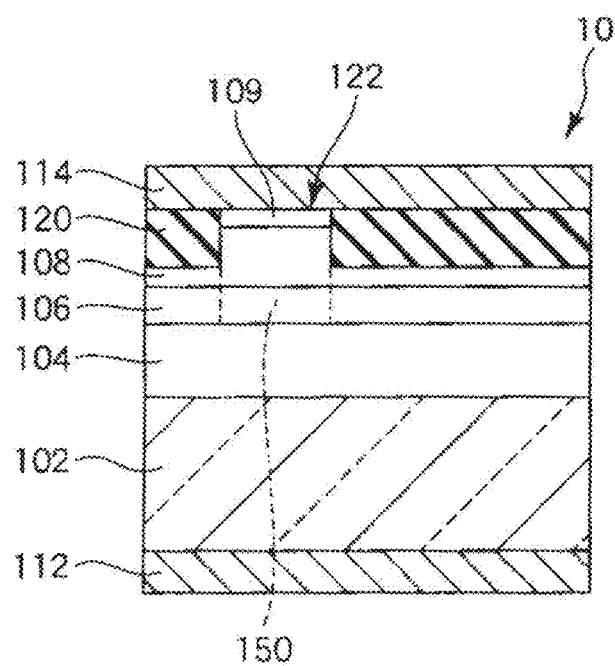
FIG. 3 is a cross-sectional view taken along the line A-A in FIG. 2.

FIG. 1 is a cross-sectional view showing the light-emitting device according to the first embodiment of the invention. FIG. 2 is a plan view schematically showing a semiconductor light-emitting element included in the light-emitting device shown in FIG. 1. FIG. 3 is a cross-sectional view taken along the line A-A in FIG. 2. FIGS. 4A to 7B are cross-sectional views for explaining the method of manufacturing the light-emitting device shown in FIG. 1. FIGS. 8A and 8B are each an SEM image of a bonding layer.

Light-Emitting Device

The light-emitting device 100 shown in FIG. 1 includes a semiconductor light-emitting element 10, a substrate 20, and a bonding layer 30 that bonds the semiconductor light-emitting element 10 and the substrate 20 together. The semiconductor light-emitting element 10, the substrate 20, and the bonding layer 30 will be sequentially described below.

Semiconductor Light-Emitting Element

The semiconductor light-emitting element 10 is a super luminescent diode (SLD). For example, since the SLD can reduce speckle noise compared to a semiconductor laser and can achieve higher output compared to an LED, the SLD is preferred when the light-emitting device 100 is used for, for example, a light source of a projector or the like. However, the semiconductor light-emitting element 10 is not limited to the SLD, and may be, for example, a semiconductor laser or an LED.

As shown in FIGS. 2 and 3, the semiconductor light-emitting element 10 has a configuration in which a substrate 102, a first cladding layer 104, an active layer 106, a second cladding layer 108, a contact layer 109, a first electrode 112, a second electrode 114, and an insulating portion 120 are stacked.

As the substrate 102, for example, a first conductivity type (for example, an n-type) GaAs substrate or the like can be used.

The first cladding layer 104 is formed on the substrate 102. As the first cladding layer 104, for example, an n-type InGaAlP layer or the like can be used.

The active layer 106 is formed on the first cladding layer 104. The active layer 106 can have, for example, a multi-quantum well (MQW) structure in which three quantum well structures each composed of an InGaP well layer and an InGaAlP barrier layer are stacked. In the embodiment, the active layer 106 includes a first side surface 131 at which light exiting portions 11 are formed, and a second side surface 132 and a third side surface 133 that are inclined to the first side surface 131.

Portions of the active layer 106 constitute a first gain region 150, a second gain region 160, and a third gain region 170. The gain regions 150, 160, and 170 can produce light, which can be guided through the gain regions 150, 160, and 170 while receiving gain.

The first gain region 150 is provided from the second side surface 132 to the third side surface 133, and provided parallel to the first side surface 131. The second gain region 160 is provided from the second side surface 132 to the first side surface 131, and overlaps the first gain region 150 at the second side surface 132. The third gain region 170 is provided from the third side surface 133 to the first side surface 131, and overlaps the first gain region 150 at the third side surface 133.

As to the light produced in the gain regions 150, 160, and 170, the reflectance of the first side surface 131 is lower than the reflectance of the second side surface 132 and the reflectance of the third side surface 133. With this configuration, a connecting portion between the second gain region 160 and the first side surface 131 and a connecting portion between the third gain region 170 and the first side surface 131 can serve as the light exiting portions 11. Moreover, the second and third side surfaces 132 and 133 can serve as reflective surfaces.

The gain regions 160 and 170 are connected to the first side surface 131 obliquely with respect to a normal P of the first side surface 131. With this configuration, direct multiple reflection of the light produced in the gain regions 150, 160, and 170 can be prevented between an edge face of the second gain region 160 at the first side surface 131 and an edge face of the third gain region 170 at the first side surface 131. As a result, the formation of a direct resonator can be prevented, and therefore, laser oscillation of the light produced in the gain regions 150, 160, and 170 can be suppressed or prevented.

The gain regions 150, 160, and 170 can constitute a gain region group 180. In the semiconductor light-emitting element 10, one gain region group 180 is provided. The number of gain region groups 180 is not particularly limited, and may be two or more.

The second cladding layer 108 is formed on the active layer 106. As the second cladding layer 108, for example, a second conductivity type (for example, a p-type) InGaAlP layer or the like can be used. For example, the p-type second cladding layer 108, the active layer 106 into which an impurity is not doped, and the n-type first cladding layer 104 constitute a pin diode. Each of the first cladding layer 104 and the second cladding layer 108 is a layer whose forbidden band width is larger than that of the active layer 106 and whose refractive index is lower than that of the active layer 106. The active layer 106 has functions of producing light and guiding the light while amplifying the light. The first cladding layer 104 and the second cladding layer 108 have a function of interposing the active layer 106 therebetween to confine injected carriers (electrons and holes) and light (function of suppressing light leakage).

In the semiconductor light-emitting element 10, when a forward bias voltage of the pin diode is applied (current is injected) between the first electrode 112 and the second electrode 114, the gain regions 150, 160, and 170 occur in the active layer 106, and recombination of electrons and holes occurs in the gain regions 150, 160, and 170. The recombination causes light emission. With the light thus produced as a starting point, stimulated emission occurs in a chain reaction manner, so that the intensity of light is amplified in the gain regions 150, 160, and 170. Then, the light whose intensity is amplified exits as light L through the light exiting portion 11. That is, the semiconductor light-emitting element 10 is an edge-emitting semiconductor light-emitting element.

The contact layer 109 and a portion of the second cladding layer 108 constitute a columnar portion 122. The planar shape of the columnar portion 122 is the same as the planar shape of the gain regions 150, 160, and 170. That is, the planar shape of an upper surface of the contact layer 109 is the same as the planar shape of the gain regions 150, 160, and 170. For example, a current path between the first and second electrodes 112 and 114 is determined by the planar shape of the columnar portion 122, and as a result, the planar shape of the gain regions 150, 160, and 170 is determined.

The insulating portion 120 is provided laterally to the columnar portion 122 on the second cladding layer 108. As the insulating portion 120, for example, a SiN layer, a SiO$_2$ layer, a SiON layer, an Al$_2$O$_3$ layer, or a polyimide layer can be used. When the material described above is used as the insulating portion 120, the current between the first and second electrodes 112 and 114 can flow through the columnar portion 122 put in the insulating portion 120 while avoiding the insulating portion 120. The insulating portion 120 has a refractive index lower than the refractive index of the second cladding layer 108. In this case, the effective refractive index of a vertical section of a portion where the insulating portion 120 is formed is lower than the effective refractive index of a vertical section of a portion where the insulating portion 120 is not formed, that is, a portion where the columnar portion 122 is formed. With this configuration, light can be efficiently confined in the planar direction in the gain regions 150, 160, and 170.

The first electrode 112 is formed on the entire lower surface of the substrate 102. As the first electrode 112, for example, an electrode having a Cr layer, an AuGe layer, a Ni layer, and an Au layer stacked in this order from the substrate 102 side can be used.

The second electrode 114 is formed on the contact layer 109. The planar shape of the second electrode 114 is, for example, the same as the planar shape of the gain regions 150, 160, and 170. As the second electrode 114, for example, an electrode having a Cr layer, an AuZn layer, and an Au layer stacked in this order from the contact layer 109 side can be used.

The semiconductor light-emitting element 10 is formed by semiconductor processing techniques such as a photolithographic technique and an etching technique.

As shown in FIG. 1, the semiconductor light-emitting element 10 having the configuration described above is mounted in a junction-down state on the substrate 20. That is, the semiconductor light-emitting element 10 is mounted with the second electrode 114 side facing the substrate 20 (turned upside down from the example of FIG. 3) so that the active layer 106 is located closer to the substrate 20 side than the substrate 102 of the semiconductor light-emitting element 10. Since the semiconductor light-emitting element 10 is an edge-emitting semiconductor light-emitting element, the light L exiting through the light exiting portion 11 travels in a direction along a main surface of the substrate 20.

Substrate

The substrate 20 has mainly a function of supporting the semiconductor light-emitting element 10 and a function of dissipating the heat of the semiconductor light-emitting element 10. The substrate 20 is composed of, for example, a silicon substrate, alumina, or the like. A wiring pattern 40 is formed on an upper surface (surface on the semiconductor light-emitting element 10 side) of the substrate 20.

Bonding Layer

The bonding layer 30 includes a first bonding layer 31 disposed on an upper surface of the substrate 20, a second bonding layer 32 provided on a lower surface of the semiconductor light-emitting element 10, and a third bonding layer 33 provided (intervening) between the first bonding layer 31 and the second bonding layer 32, and is composed of a stacked body including these layers. The first, second, and third bonding layers 31, 32, and 33 preferably have a thermal conductivity of 200 W/K·m or more. With this configuration, a sufficiently high thermal conductivity can be provided to the bonding layer 30, and thus the heat of the semiconductor light-emitting element 10 can be more efficiently conducted to the substrate 20.

Each of the first, second, and third bonding layers 31, 32, and 33 is formed by sintering a conductive paste as will be described also in a manufacturing method described later.

Method of Manufacturing Light-Emitting Device

Next, a method of manufacturing the light-emitting device 100 will be described with reference to the drawings.

The method of manufacturing the light-emitting device 100 includes a first bonding layer forming step, a second bonding layer forming step, a polishing step, and a third bonding layer forming step. In the first bonding layer forming step, a first conductive paste 310 is disposed on the substrate 20, and the first conductive paste 310 is sintered to form the first bonding layer 31. In the second bonding layer forming step, a second conductive paste 320 is disposed on the semiconductor light-emitting element 10, and the second conductive paste 320 is sintered to form the second bonding layer 32. In the polishing step, surfaces of the first and second bonding layers 31 and 32 are polished. In the third bonding layer forming step, a third conductive paste 330 is caused to intervene between the first bonding layer 31 and the second bonding layer 32, and the third conductive paste 330 is sintered to form the third bonding layer 33.

First Bonding Layer Forming Step

Figure 4A:
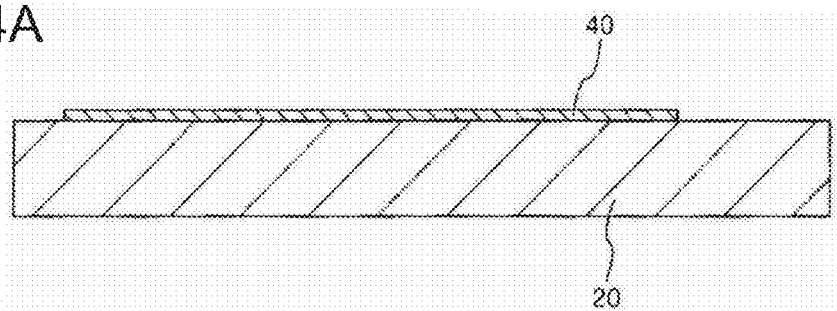
FIGS. 4A to 4C are cross-sectional views for explaining a method of manufacturing the light-emitting device shown in FIG. 1.
Figure 4B:
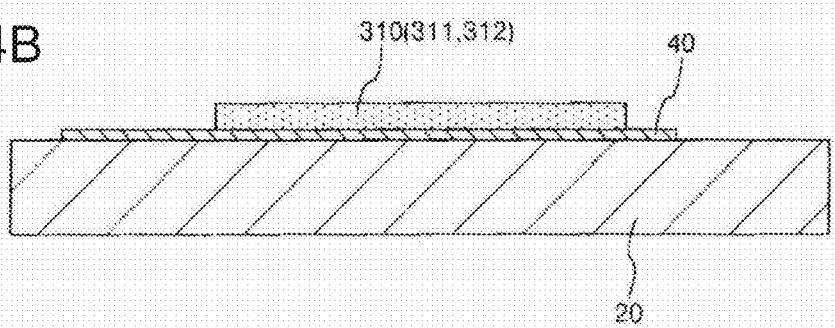

First, as shown in FIG. 4A, the substrate 20 on the upper surface of which the wiring pattern 40 is formed is prepared. As the substrate 20, a silicon substrate, alumina, or the like can be used. Next, as shown in FIG. 4B, the first conductive paste 310 is supplied and disposed on an upper surface of the substrate 20. The first conductive paste 310 can be supplied and disposed by, for example, a screen printing method. However, a method of supplying and disposing the first conductive paste 310 on the substrate 20 is not limited to a screen printing method, and the first conductive paste 310 may be supplied and disposed by, for example, a dispense method using a dispenser.

Here, the first conductive paste 310 is not particularly limited, but, for example, a paste obtained by dispersing metal particles 312 into a solvent 311 can be used. The metal particles 312 are not particularly limited, and, for example, silver particles, copper particles, or the like can be used. The particle size (diameter) of the metal particles 312 is not particularly limited, but the metal particles 312 preferably include, for example, particles having a particle size of about from 1 nm to 100 nm. That is, the metal particles 312 preferably include so-called "metal nanoparticles". With this configuration, the first bonding layer 31 having a low melting point and a high thermal conductivity can be formed. As the solvent 311, on the other hand, for example, hydrocarbon-based solvents such as n-hexane, n-heptane, n-undecane, and toluene, higher alcohols such as n-nonanol and n-undecanol, alcohols such as octanol and terpineol, or aqueous solvents can be used. As the first conductive paste 310, a paste composed of metal particles and a binder (resin adhesive or the like) may be used.

Figure 4C:
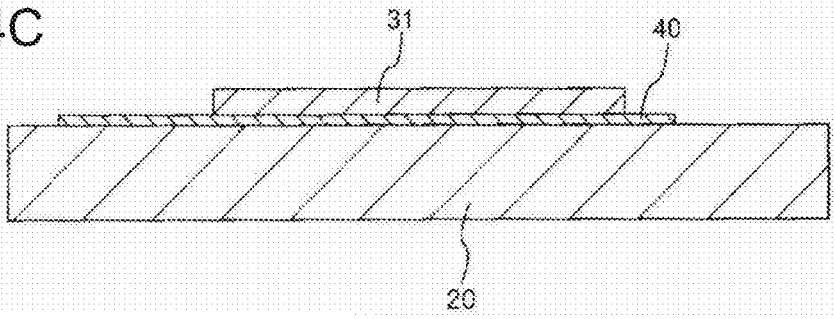

Next, the first conductive paste 310 is subjected to a sintering process to form the first bonding layer 31 as shown in FIG. 4C.

Second Bonding Layer Forming Step

Figure 5A:
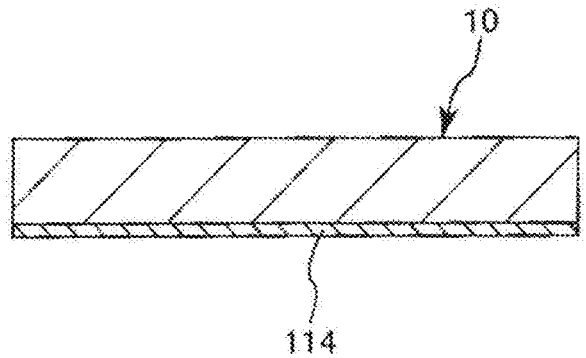
FIGS. 5A to 5C are cross-sectional views for explaining the method of manufacturing the light-emitting device shown in FIG. 1.
Figure 5B:
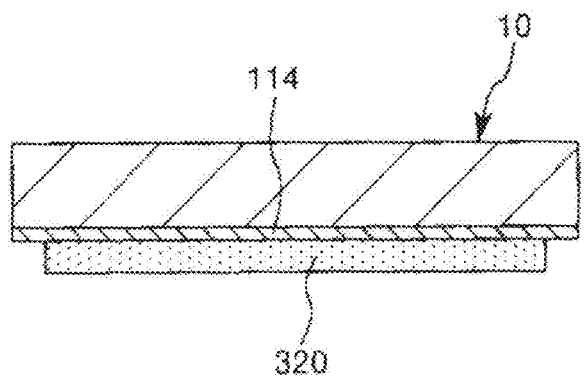

Next, as shown in FIG. 5A, the semiconductor light-emitting element 10 is prepared. Next, as shown in FIG. 5B, the second conductive paste 320 is supplied and disposed on a surface of the second electrode 114 of the semiconductor light-emitting element 10. The second conductive paste 320 can be supplied and disposed by, for example, a screen printing method. However, a method of supplying and disposing the second conductive paste 320 on the semiconductor light-emitting element 10 is not limited to a screen printing method, and, for example, the second conductive paste 320 may be supplied and disposed by a dispense method using a dispenser. The second conductive paste 320 is not particularly limited, and, for example, the same paste as the first conductive paste 310 can be used.

Figure 5C:
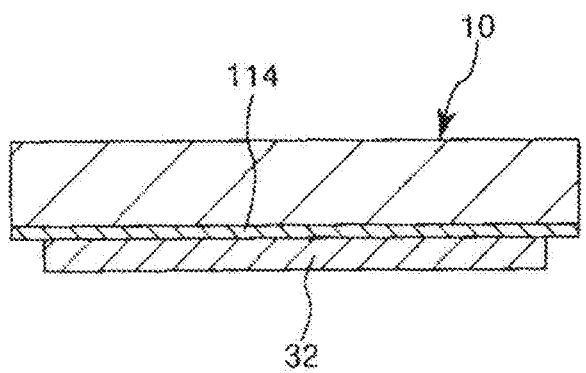

Next, the second conductive paste 320 is subjected to a sintering process to form the second bonding layer 32 as shown in FIG. 5C.

Polishing Step

Figure 6A:
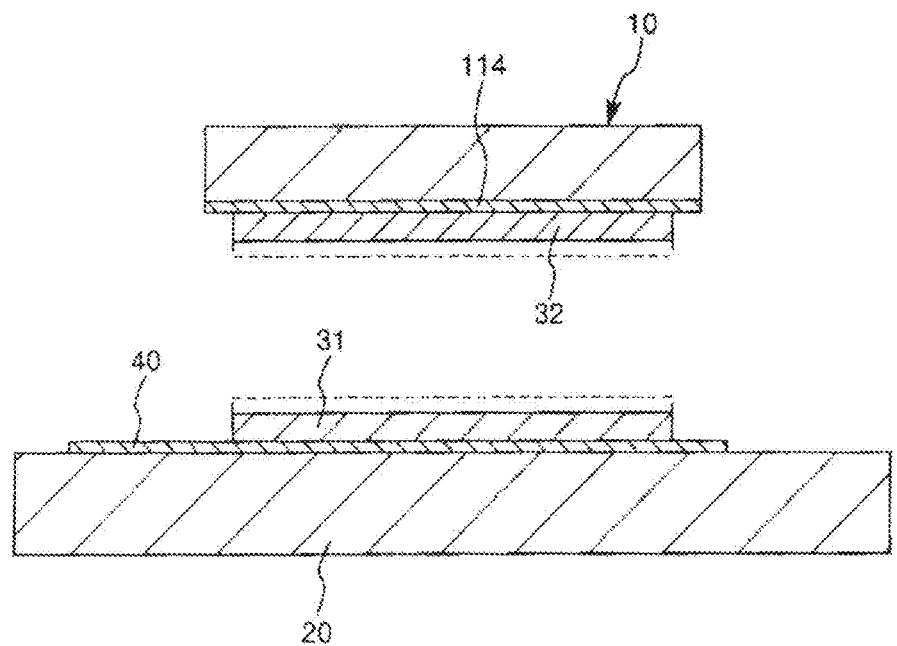
FIGS. 6A and 6B are cross-sectional views for explaining the method of manufacturing the light-emitting device shown in FIG. 1.

Next, as shown in FIG. 6A, the surfaces of the first and second bonding layers 31 and 32 are polished to planarize the surfaces of the first and second bonding layers 31 and 32. With this configuration, in the later third bonding layer forming step, the occurrence of voids can be suppressed between the first bonding layer 31 and the third bonding layer 33 and between the second bonding layer 32 and the third bonding layer 33. Moreover, by polishing the surfaces of the first and second bonding layers 31 and 32, an unwanted film such as an oxide film that is formed on the surface can be removed, and therefore, the first and second bonding layers 31 and 32 and the third bonding layer 33 can be more firmly bonded together. The polishing method is not particularly limited, and the surfaces can be polished by, for example, lap polishing, chemical-mechanical polishing (CMP), plasma treatment, or the like. Among them, lap polishing is preferably used. Since lap polishing does not use a slurry, unlike CMP, and does not require a special apparatus, unlike plasma treatment, lap polishing has excellent workability compared to other methods.

As to the degree of planarization, the surfaces of the first and second bonding layers 31 and 32 preferably have mirror surfaces. In other words, Ra, which is an index representing a surface roughness, is preferably 10 µm or less, and more preferably 1 µm or less. With this configuration, the surfaces of the first and second bonding layers 31 and 32 are sufficiently planarized, and thus the advantageous effect described above can be more remarkably provided.

Third Bonding Layer Forming Step

Figure 6B:
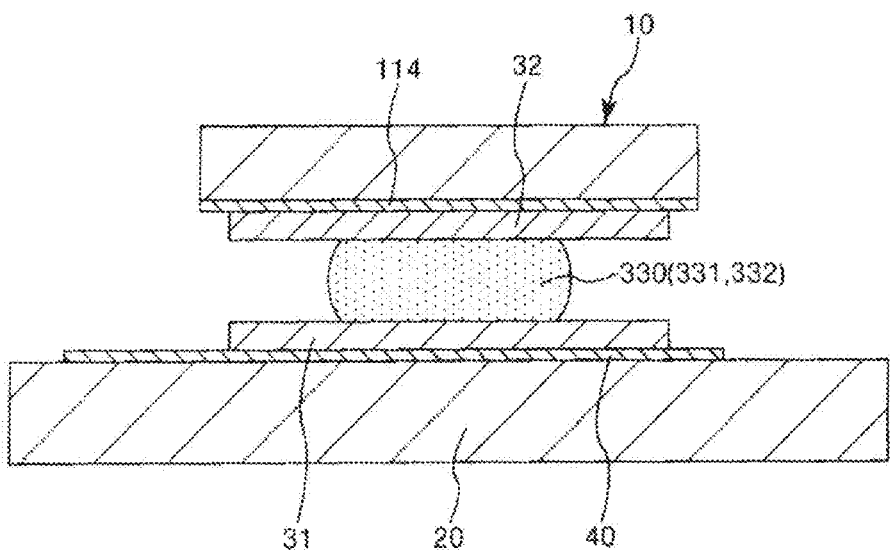

Next, as shown in FIG. 6B, the third conductive paste 330 is caused to intervene between the first bonding layer 31 and the second bonding layer 32, and the substrate 20 and the semiconductor light-emitting element 10 are overlapped together. The third conductive paste 330 is not particularly limited, and, for example, a paste obtained by dispersing metal particles 332 into a solvent 331 can be used. The metal particles 332 are not particularly limited, and silver particles, copper particles, or the like can be used. The particle size (diameter) of the metal particles 332 is not particularly limited, but the metal particles 332 preferably include, for example, particles having a particle size of about from 1 nm to 100 nm. That is, the metal particles 332 preferably include so-called "metal nanoparticles". Since the metal particles 332 include particles having a minute particle size, the melting point can be lowered, and thus the metal particles 332 are fused at a low temperature. That is, the firing temperature of the third conductive paste 330 can be lowered, and thus thermal damage to the semiconductor light-emitting element 10 or the substrate 20 can be reduced. As the solvent 331, on the other hand, for example, hydrocarbon-based solvents such as n-hexane, n-heptane, n-undecane, and toluene, higher alcohols such as n-nonanol and n-undecanol, alcohols such as octanol and terpineol, or aqueous solvents can be used. As the third conductive paste 330, a paste composed of metal particles and a binder (resin adhesive or the like) may be used.

Figure 7A:
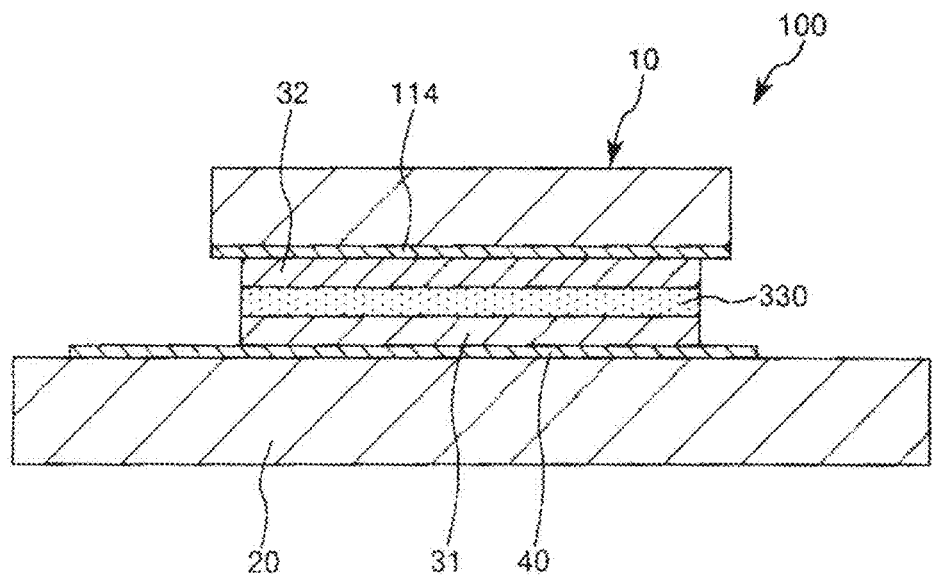
FIGS. 7A and 7B are cross-sectional views for explaining the method of manufacturing the light-emitting device shown in FIG. 1.
Figure 8A:
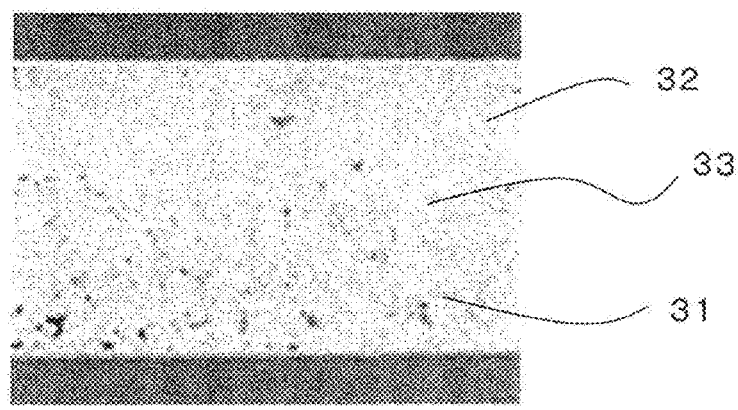
FIGS. 8A and 8B are each an SEM image of a bonding layer.
Figure 8B:
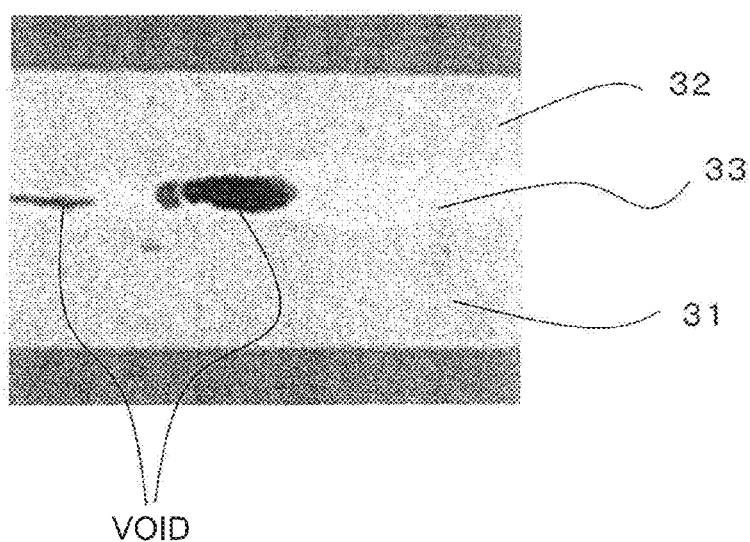

Next, as shown in FIG. 7A, at least one of the substrate 20 and the semiconductor light-emitting element 10 is pressed against the other to thereby spread the third conductive paste 330 between the first bonding layer 31 and the second bonding layer 32. In this case, it is preferable that the third conductive paste 330 does not protrude from between the first bonding layer 31 and the second bonding layer 32. That is, it is preferable that the entire region of the third conductive paste 330 is located (contained) within a region interposed between the first bonding layer 31 and the second bonding layer 32. With this configuration, it is possible to prevent the third conductive paste 330 that protrudes from therebetween from causing a short circuit due to contact with the electrode of the semiconductor light-emitting element 10 or the wiring pattern 40.

Figure 7B:
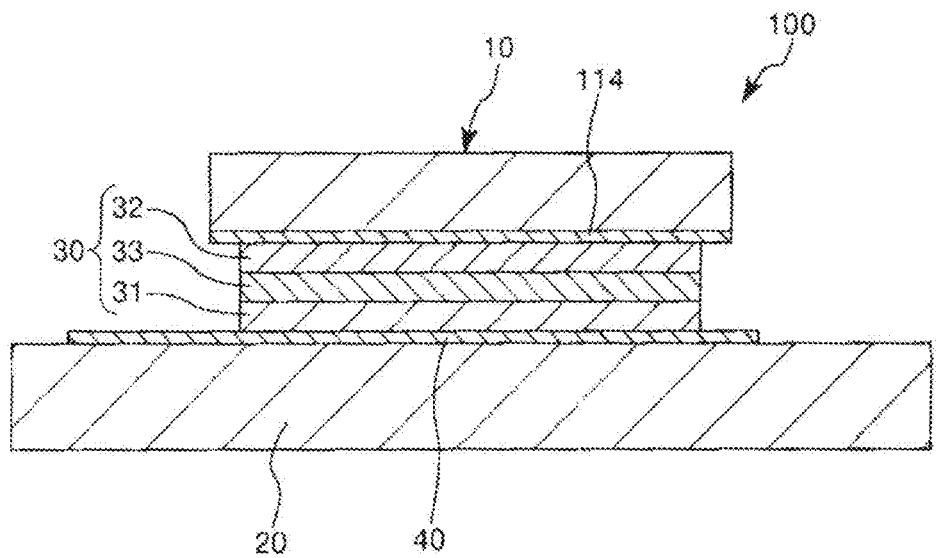

Next, as shown in FIG. 7B, the third conductive paste 330 is subjected to a sintering process to form the third bonding layer 33 bonded with the first and second bonding layers 31 and 32. With this configuration, the bonding layer 30 formed of the first, second, and third bonding layers 31, 32, and 33 is formed, and the substrate 20 and the semiconductor light-emitting element 10 are bonded via the bonding layer 30.

Through the steps described above, the light-emitting device 100 is obtained.

According to the manufacturing method, since the polishing step is included, the occurrence of voids can be effectively suppressed between the first bonding layer 31 and the third bonding layer 33 and between the second bonding layer 32 and the third bonding layer 33, and thus the heat transfer efficiency of the bonding layer 30 can be maintained high. Therefore, the light-emitting device 100 having excellent heat dissipation property can be manufactured.

FIG. 8A shows an SEM image of a cross section of a bonding layer of a light-emitting device 100 manufactured by the manufacturing method of the embodiment; and FIG. 8B shows an SEM image of a cross section of a bonding layer of a light-emitting device 100 manufactured by a manufacturing method obtained by excluding the polishing step from the manufacturing method of the embodiment. It is found that the occurrence of voids is suppressed in the bonding layer shown in FIG. 8A while voids occur in the bonding layer shown in FIG. 8B.

Second Embodiment

Figure 9:
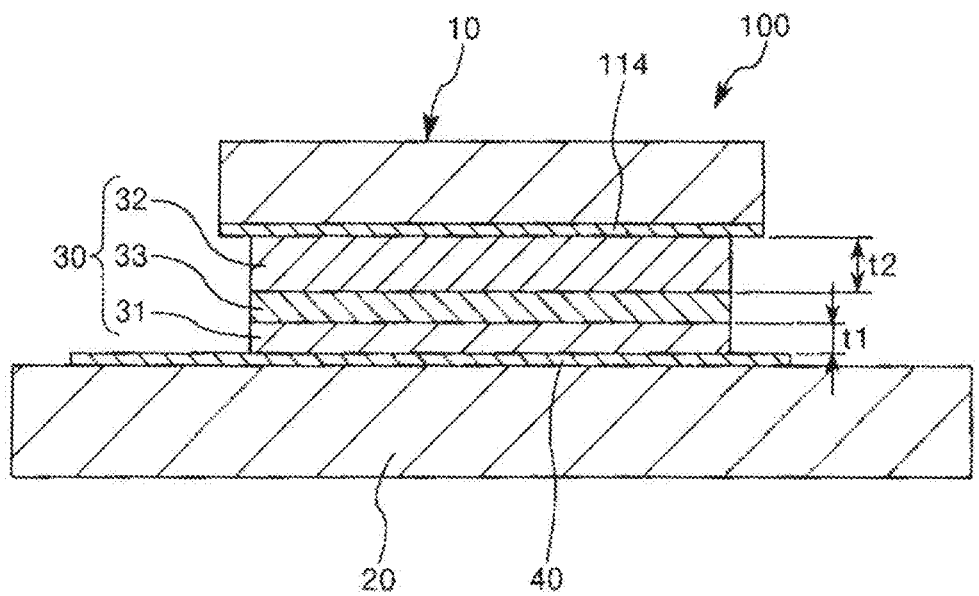
FIG. 9 is a cross-sectional view of a light-emitting device according to a second embodiment of the invention.
Figure 10:
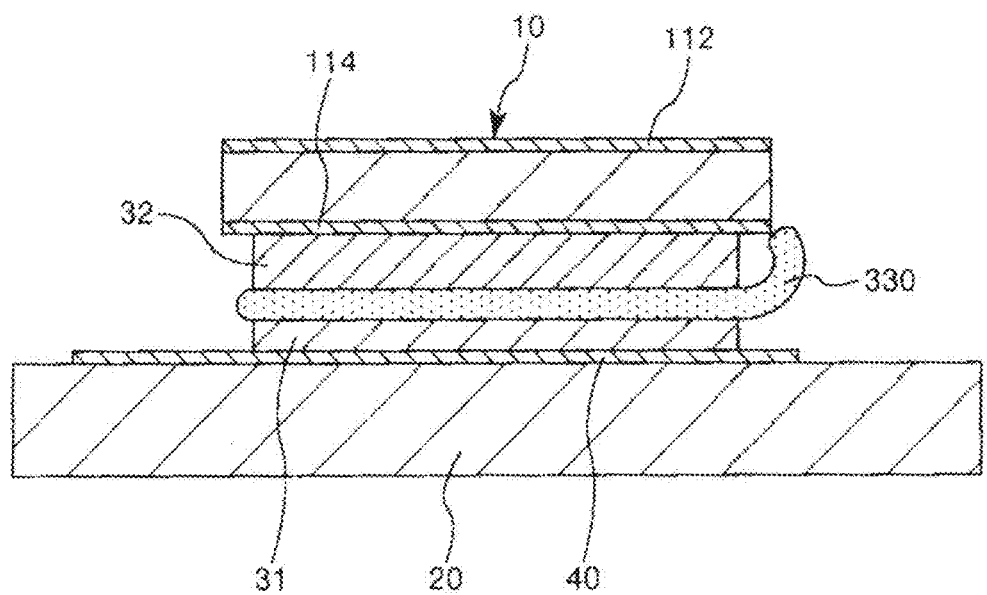
FIG. 10 is a cross-sectional view showing a manufacturing process of the light-emitting device shown in FIG. 9.

FIG. 9 is a cross-sectional view of a light-emitting device according to a second embodiment of the invention. FIG. 10 is a cross-sectional view showing a manufacturing process of the light-emitting device shown in FIG. 9.

The light-emitting device of the second embodiment will be described below, in which differences from the embodiment described above are mainly described and the description of similar matters is omitted.

The light-emitting device of the second embodiment is similar to the light-emitting device of the first embodiment described above, except that a thickness relation between the first and second bonding layers is different. In FIGS. 8A and 8B, configurations similar to those of the embodiment described above are denoted by the same reference signs and numerals.

As shown in FIG. 9, in the light-emitting device 100 of the embodiment, the thickness of the second bonding layer 32 is larger than the thickness of the first bonding layer 31. The thickness relation between the first and second bonding layers 31 and 32 is not particularly limited as long as the relation of t1<t2 is satisfied where t1 is the thickness of the first bonding layer 31 and t2 is the thickness of the second bonding layer 32. However, t1:t2 preferably falls within a range of from 4:6 to 1:9. By satisfying the relation of t1<t2 as described above, for example, the first electrode 112 of the semiconductor light-emitting element 10 can be widely spaced apart from the third bonding layer 33 in the height direction. Therefore, even if, for example, the third conductive paste 330 protrudes from between the first and second bonding layers 31 and 32 and bends toward the semiconductor light-emitting element 10 side in the manufacturing process of the light-emitting device 100 as shown in FIG. 10, contacting of the third conductive paste 330 with the first electrode 112 can be effectively suppressed. Therefore, the occurrence of an unintended short circuit can be effectively suppressed.

Advantageous effects similar to those of the first embodiment described above can be provided according also to the second embodiment.

2. Projector

Next, a projector according to the invention will be described. However, the configuration shown below is illustrative only, and the configuration of the projector according to the invention is not limited to the following configuration.

Figure 11:
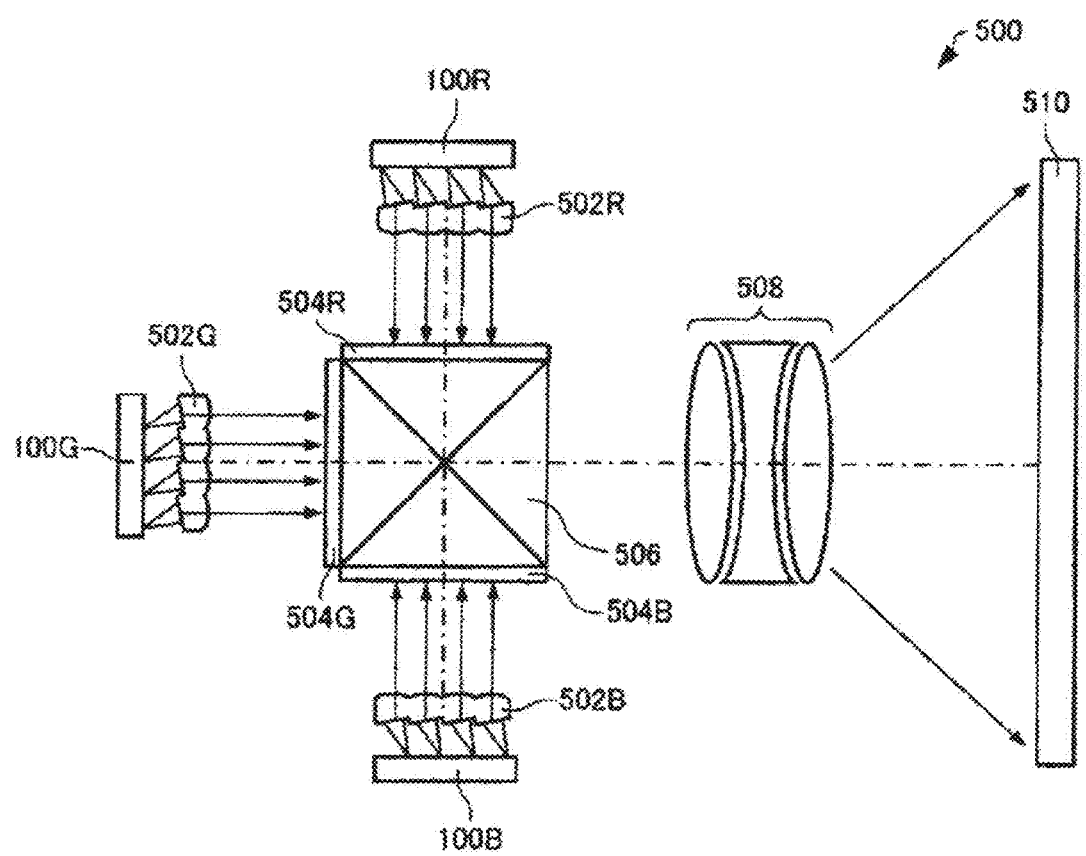
FIG. 11 is a configuration diagram showing an example of an optical system of a projector according to the invention.

As shown in FIG. 11, the projector 500 includes a red light source 100R, a green light source 100G, and a blue light source 100B that emit red light, green light, and blue light. As each of the light sources 100R, 100G, and 100B, the light-emitting device 100 described above can be used.

The projector 500 further includes lens arrays 502R, 502G, and 502B, transmissive liquid crystal light valves (light modulators) 504R, 504G, and 504B, and a projection lens (projection device) 508.

The lights emitted from the light sources 100R, 100G, and 100B are incident on the respective lens arrays 502R, 502G, and 502B. Incident surfaces of the lens arrays 502R, 502G, and 502B are inclined at a predetermined angle to, for example, the optical axes of the lights emitted from the light sources 100R, 100G, and 100B. With this configuration, the optical axes of the lights emitted from the light sources 100R, 100G, and 100B can be changed. Hence, for example, the lights emitted from the light sources 100R, 100G, and 100B can be made orthogonal to irradiated surfaces of the liquid crystal light valves 504R, 504G, and 504B. Especially when the gain regions 160 and 170 of the semiconductor light-emitting element 10 are provided obliquely with respect to the first side surface 131 as shown in FIG. 2, light emitted from the light-emitting device 100 travels obliquely with respect to the normal P of the first side surface 131. Therefore, the incident surfaces of the lens arrays 502R, 502G, and 502B are desirably inclined at a predetermined angle.

The lens arrays 502R, 502G, and 502B include convex curved surfaces on the liquid crystal light valves 504R, 504G, and 504B side. With this configuration, the light whose optical axis is changed at the incident surface of each of the lens arrays 502R, 502G, and 502B is condensed (or the diffusion angle can be reduced) by the convex curved surface. Hence, the liquid crystal light valves 504R, 504G, and 504B can be irradiated with good uniformity. As described above, the lens arrays 502R, 502G, and 502B can control the optical axes of the lights emitted from the light sources 100R, 100G, and 100B to condense the lights.

The lights condensed by the respective lens arrays 502R, 502G, and 502B are incident on the respective liquid crystal light valves 504R, 504G, and 504B. The liquid crystal light valves 504R, 504G, and 504B each modulate the incident light in response to image information.

The three colored lights modulated by the respective liquid crystal light valves 504R, 504G, and 504B are incident on a cross dichroic prism 506. The cross dichroic prism 506 is formed by, for example, bonding four right-angle prisms together, and a dielectric multilayer film that reflects red light and a dielectric multilayer film that reflects blue light are provided crosswise on its inner surface. The three colored lights are combined by the dielectric multilayer films.

The light combined by the cross dichroic prism 506 is incident on a projection lens 508 as a projection optical system. The projection lens 508 enlarges an image formed by the liquid crystal light valves 504R, 504G, and 504B, and projects the image onto a screen (display surface) 510. With this configuration, a desired video is displayed on the screen 510.

The projector 500 has been described above.

Although, in the example described above, the transmissive liquid crystal light valve is used as the light modulator, a light valve other than a liquid crystal light valve may be used, or a reflective light valve may be used. Examples of the light valves include, for example, a reflective liquid crystal light valve and a digital micromirror device. Moreover, the configuration of the projection optical system is appropriately changed depending on the type of a light valve to be used.

Moreover, the light sources 100R, 100G, and 100B can be applied to a light source device of a scanning type image display apparatus (projector) including a scanning unit as an image forming apparatus that displays an image having a desired size on a display surface by scanning the lights from the light sources onto a screen.

Although the method of manufacturing the light-emitting device, the light-emitting device, and the projector according to the invention have been described based on the embodiments shown in the drawings, the invention is not limited to the embodiments. The configuration of each part can be replaced with any configuration having a similar function. Moreover, any other configurations may be added to the invention. Moreover, the embodiments described above may be appropriately combined together.

The entire disclosure of Japanese Patent Application No. 2014-065274, filed Mar. 27, 2014 is expressly incorporated by reference herein.

What is claimed is:

1. A method of manufacturing a light-emitting device, comprising:
    disposing a first conductive paste on a substrate and sintering the first conductive paste to form a first bonding layer;
    disposing a second conductive paste on a semiconductor light-emitting element and sintering the second conductive paste to form a second bonding layer;
    polishing surfaces of the first bonding layer and the second bonding layer; and
    causing a third conductive paste to intervene between the first bonding layer and the second bonding layer and sintering the third conductive paste to bond the first bonding layer and the second bonding layer together.

2. The method of manufacturing a light-emitting device according to claim 1, wherein the first conductive paste, the second conductive paste, and the third conductive paste include metal particles having a particle size of from 1 nm to 100 nm.

3. The method of manufacturing a light-emitting device according to claim 1, wherein the second bonding layer is thicker than the first bonding layer.

4. The method of manufacturing a light-emitting device according to claim 1, wherein a surface roughness Ra of the first bonding layer and the second bonding layer is 10 μm or less.

5. The method of manufacturing a light-emitting device according to claim 1, wherein, in the polishing of the surfaces of the first bonding layer and the second bonding layer, the surfaces of the first bonding layer and the second bonding layer are polished by lap polishing.

6. The method of manufacturing a light-emitting device according to claim 1, wherein an entire region of the third bonding layer is located within a region between the first bonding layer and the second bonding layer.

7. A light-emitting device manufactured by the method of manufacturing a light-emitting device according to claim 1.

8. A light-emitting device manufactured by the method of manufacturing a light-emitting device according to claim 2.

9. A light-emitting device manufactured by the method of manufacturing a light-emitting device according to claim 3.

10. A light-emitting device manufactured by the method of manufacturing a light-emitting device according to claim 4.

11. A light-emitting device manufactured by the method of manufacturing a light-emitting device according to claim 5.

12. A light-emitting device manufactured by the method of manufacturing a light-emitting device according to claim 6.

13. A projector comprising:
    the light-emitting device according to claim 7;
    a light modulator that modulates light emitted from the light-emitting device in response to image information; and
    a projection device that projects an image formed by the light modulator.

14. A projector comprising:
    the light-emitting device according to claim 8;
    a light modulator that modulates light emitted from the light-emitting device in response to image information; and
    a projection device that projects an image formed by the light modulator.

15. A projector comprising:
    the light-emitting device according to claim 9;
    a light modulator that modulates light emitted from the light-emitting device in response to image information; and
    a projection device that projects an image formed by the light modulator.

16. A projector comprising:
    the light-emitting device according to claim 10;
    a light modulator that modulates light emitted from the light-emitting device in response to image information; and
    a projection device that projects an image formed by the light modulator.

17. A projector comprising:
    the light-emitting device according to claim 11;
    a light modulator that modulates light emitted from the light-emitting device in response to image information; and
    a projection device that projects an image formed by the light modulator.

18. A projector comprising:
    the light-emitting device according to claim 12;
    a light modulator that modulates light emitted from the light-emitting device in response to image information; and
    a projection device that projects an image formed by the light modulator.

* * * * *